(12) United States Patent
Oi

(10) Patent No.: US 11,137,708 B2
(45) Date of Patent: Oct. 5, 2021

(54) ENERGIZATION CONTROL DEVICE AND IMAGE FORMING APPARATUS

(71) Applicant: CANON KABUSHIKI KAISHA, Tokyo (JP)

(72) Inventor: Ken Oi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/920,259

(22) Filed: Jul. 2, 2020

(65) Prior Publication Data

US 2021/0011410 A1    Jan. 14, 2021

(30) Foreign Application Priority Data

Jul. 12, 2019 (JP) .............................. JP2019-130429

(51) Int. Cl.
| | |
|---|---|
| *G03G 15/00* | (2006.01) |
| *H05B 1/00* | (2006.01) |
| *G01R 19/00* | (2006.01) |
| *G01R 19/165* | (2006.01) |
| *G01R 19/175* | (2006.01) |
| *G03G 15/20* | (2006.01) |
| *H05B 1/02* | (2006.01) |

(52) U.S. Cl.
CPC ... *G03G 15/5004* (2013.01); *G01R 19/16528* (2013.01); *G01R 19/175* (2013.01); *G03G 15/2014* (2013.01); *G03G 15/2039* (2013.01); *G03G 15/80* (2013.01); *H05B 1/0241* (2013.01)

(58) Field of Classification Search
CPC ........... G03G 15/2039; G03G 15/5004; G03G 15/80; H05B 1/0241; H05B 3/0066; G01R 19/16528; G01R 19/175
USPC .... 399/69, 88; 219/216, 245, 256, 388, 482, 219/497
See application file for complete search history.

(56) References Cited

U.S. PATENT DOCUMENTS

| | | | |
|---|---|---|---|
| 7,310,486 B2 | 12/2007 | Kawazu | |
| 9,268,268 B2 | 2/2016 | Shibasaki | |
| 2006/0093388 A1 | 5/2006 | Kawazu | |
| 2015/0003854 A1 | 1/2015 | Shibasaki | |
| 2017/0097381 A1* | 4/2017 | Stephens | ................ G01R 25/04 |

(Continued)

FOREIGN PATENT DOCUMENTS

| | | |
|---|---|---|
| JP | H10-186908 | 7/1998 |
| JP | 2001-52841 | 2/2001 |

(Continued)

*Primary Examiner* — Robert B Beatty
(74) *Attorney, Agent, or Firm* — Venable LLP

(57) ABSTRACT

An energization control device includes a voltage detection unit, a control portion, and an energization switching unit. The control portion to which the first detection signal and the second detection signal are input from the voltage detection unit is configured to output a first energization signal if the first detection signal is input and output a second energization signal if the second detection signal is input. The control portion is configured to obtain a correction value based on a difference between a first period in which the first detection signal is input to the control portion and a second period in which the second detection signal is input to the control portion and to correct a timing of switching between the first energization signal and the second energization signal with the correction value.

17 Claims, 13 Drawing Sheets

(56) References Cited

U.S. PATENT DOCUMENTS

2018/0120742 A1* 5/2018 Masuda ............. G03G 15/2039
2020/0233350 A1* 7/2020 Oi ...................... G03G 15/2064

FOREIGN PATENT DOCUMENTS

| JP | 2006-126657 | | 5/2006 |
|----|-------------|---|--------|
| JP | 2011181273 A | * | 9/2011 |
| JP | 2015-11152 | | 1/2015 |
| JP | 2017-49541 | | 3/2017 |

* cited by examiner

ENERGIZATION CONTROL DEVICE AND IMAGE FORMING APPARATUS

BACKGROUND OF THE INVENTION

Field of the Invention

The present invention relates to an energization control device that performs energization control on an energization target, and an image forming apparatus.

Description of the Related Art

For example, a fixing unit configured to heat a toner image transferred onto a sheet to fix the toner image onto the sheet is provided in a laser printer, a multifunction machine, a FAX machine, or the like. The fixing unit is provided with a heater that generates heat by electric power of a commercial power source, and an energization control device for controlling energization of a heater performs frequency control using a switching element such as a triac with a positive half wave or a negative half wave of the commercial power source as a unit of control.

By the way, there is a problem in that since the commercial power source uses an alternating current, when a timing of turning on the switching element is not aligned with a zero-cross point at which the voltage of the commercial power source is 0, switching noise increases. Therefore, for example, as disclosed in Japanese Patent Application Laid-Open Publication No. 2006-126657, a method of detecting a zero-cross point by providing a zero-cross detection circuit illustrated in FIG. 11 can be considered.

As illustrated in FIG. 11, the zero-cross detection circuit is connected to a commercial power source 301 and includes a diode 1101, resistors 1102, 1103, 1104, 1108, 1109, and 1110, capacitors 1105 and 1111, and a photocoupler 1107. The commercial power source 301 is half-wave rectified by the diode 1101, and a base voltage is applied to the transistor 1106 by the resistors 1102 to 1104 and the capacitor 1105. When the base voltage of the transistor 1106 falls below a threshold Vthres, a diode on a light emitting side of the photocoupler 1107 is turned off. Further, when the base voltage of the transistor 1106 exceeds the threshold Vthres, the diode on the light emitting side of the photocoupler 1107 is turned on. Accordingly, as illustrated in FIG. 12, a pulse signal is a signal having a first edge in which the signal transits from a first voltage level to a second voltage level and a second edge in which the signal is changed from the second voltage level to the first voltage level.

When the triac is controlled based on this pulse signal, a first edge of a triac control reference timing has the same timing as the first edge of the pulse signal. Further, a second edge of the triac control reference timing has, as a timing, a value obtained by calculating a time corresponding to a half period of the pulse signal from a period between the two edges of the pulse signal By controlling the triac based on the timings of the two edges of the triac control reference timing, a control can be performed at a reference timing having the same time deviation amount regardless of a polarity with respect to the true zero-cross point of the commercial power source. However, unless a current flows, the threshold of the base voltage cannot be detected, and thus the threshold cannot be set to 0 V. Therefore, the two edges of the triac control reference timing has a time deviation amount by the threshold Vthres with respect to the true zero-cross point.

Further, as illustrated in FIG. 13 which a schematic diagram of a relationship between the commercial power source, the true zero-cross point, and the time deviation amount, the time deviation amount changes depending on a variation in the threshold Vthres, a commercial power source condition, and the like. FIG. 13 illustrates a case where the voltage of the commercial power source is 100 V or a case where the voltage of the commercial power source is 127 V. Here, it can be identified that the time deviation amount is larger in the case of 100 V than in the case of 127 V. As the time deviation amount increases, conduction start of the triac is deviated from the true zero-cross point, and switching noise occurring at that time increases. Therefore, although a filter may be provided to suppress emission of the switching noise to the outside of an image forming apparatus, a filter capacity to which unevenness of the time deviation amount is added is required, and thus it is difficult to downsize a filter constituting component, which hinders a downsizing of a substrate.

Therefore, a technology is proposed in which the voltage of the commercial power source is full-wave rectified, the full-wave rectified voltage is compared with a predetermined threshold, and a pulse signal having a pulse near the zero-cross point is output (see Japanese Patent Application Laid-Open Publication No. H10-186908). Further, a technology is proposed in which the zero-cross detection circuit and the voltage of the commercial power source are detected and a timing is corrected based on such a temporal difference (see Japanese Patent Application Laid-Open Publication No. 2017-49541).

However, in the technology of Japanese Patent Application Laid-Open Publication No. H10-186908, there is a problem in that a circuit is required to full-wave rectify the voltage of the commercial power source, and thus costs increase. Further, even in Japanese Patent Application Laid-Open Publication No. 2017-49541, there is a problem in that a circuit is required to detect the voltage of the commercial power source, and thus costs increase.

Thus, an object of the present invention is to provide an energization control device and an image forming apparatus which can reduce the switching noise by correcting a temporal deviation with respect to a zero-cross point in energization control while preventing cost increase.

SUMMARY OF THE INVENTION

According to a first aspect of the present invention, an energization control device that executes energization control for an energization object included in an image forming apparatus includes a voltage detection unit connected to a commercial power source and comprising a switching element configured to output a first detection signal if a voltage of the commercial power source is higher than a threshold and output a second detection signal if the voltage is lower than the threshold, a control portion to which the first detection signal and the second detection signal are input from the voltage detection unit and configured to output a first energization signal if the first detection signal is input and output a second energization signal if the second detection signal is input, and an energization switching unit connected to the commercial power source and configured to supply electric power of the commercial power source to the energization object if the first energization signal is input and not to supply the electric power of the commercial power source to the energization object if the second energization signal is input. The control portion is configured to obtain a correction value based on a difference between a first period in which the first detection signal is input to the control portion and a second period in which the second detection signal is input to the control portion and to correct a timing of switching between the first energization signal and the second energization signal with the correction value.

According to a second aspect of the present invention, an image forming apparatus includes a transfer unit configured to transfer an image to a sheet, a fixing portion comprising a heating unit that generates heat by being energized to heat the sheet to fix the image transferred by the transfer unit, and the energization control device. The energization object is the heating unit.

Further features of the present invention will become apparent from the following description of exemplary embodiments with reference to the attached drawings.

DESCRIPTION OF THE EMBODIMENTS

First Embodiment

A first embodiment of the present invention will be described below with reference to FIGS. 1 to 6. First, a schematic configuration of an image forming apparatus according to the first embodiment will be described using FIG. 1.

Figure 1:
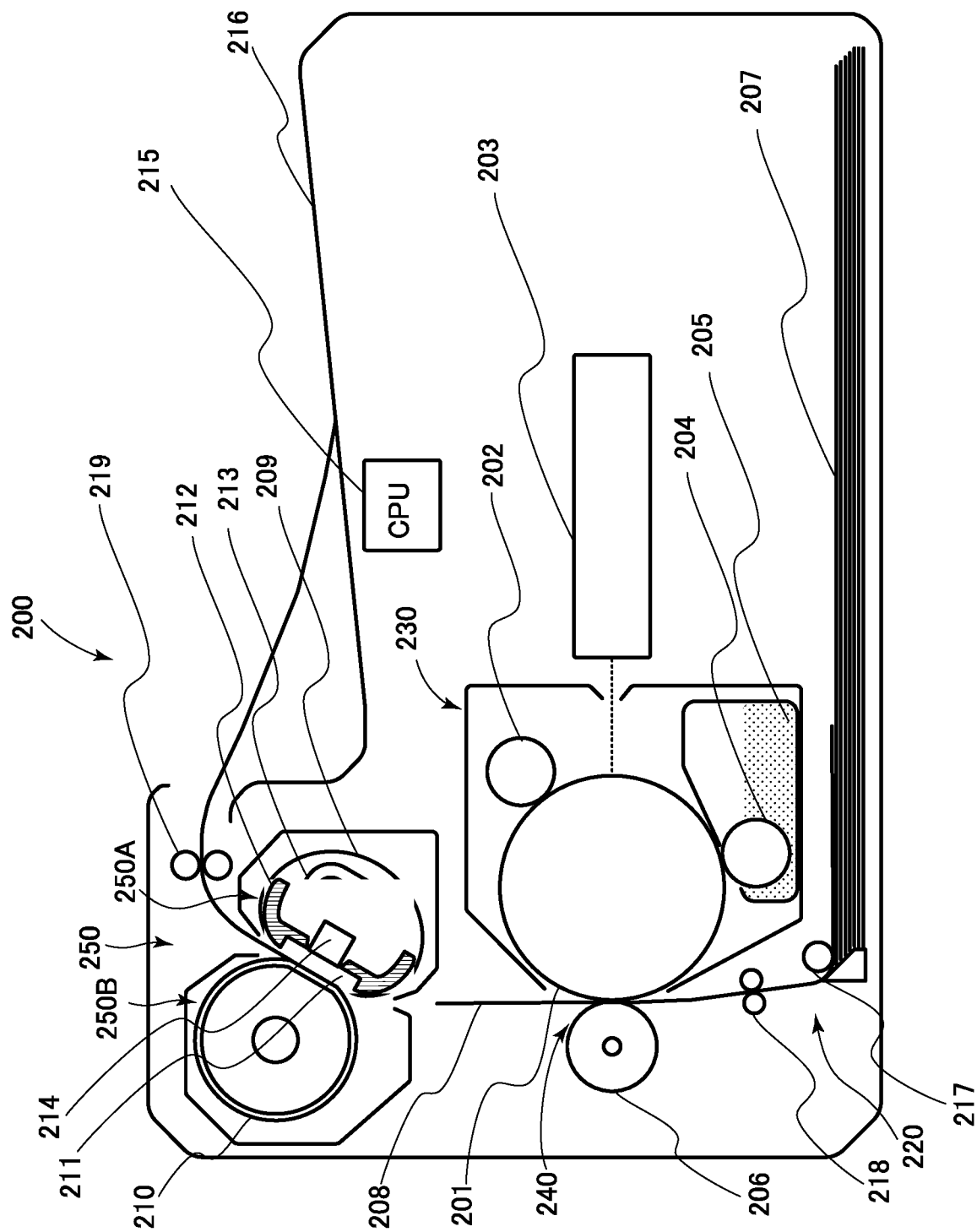
FIG. 1 is a schematic diagram illustrating an image forming apparatus according to a first embodiment.

As illustrated in FIG. 1, an image forming apparatus 200 roughly includes a sheet feeding unit 220, an image forming unit 230 that forms an image on a sheet fed from the sheet feeding unit 220, and a control portion 215 having a Central Processing Unit (CPU), and the like. The image forming unit 230 is provided with a transfer unit 240 that transfers a toner image onto the sheet, and a fixing unit 250 serving as a fixing portion that fixes the transferred toner image onto the sheet.

Specifically, the image forming unit 230 is provided with a photosensitive drum 201 having a photoconductive layer formed on the surface thereof. After the surface layer of the photosensitive drum 201 is charged by a charge roller 202, a latent image is formed on the photosensitive drum 201 by laser irradiation from a laser scanner 203, and a toner 205 is formed as a toner image on the photosensitive drum 201 by a developing roller 204. A transfer roller 206 constitutes a transfer unit 240 serving as a transfer unit by forming a transfer nip between the transfer roller 206 and the photosensitive drum 201, and the toner image formed on the photosensitive drum 201 is transferred to the sheet by applying a transfer voltage to the transfer roller 206. On the other hand, a sheet 207, which is a recording material, is started to be fed by a pickup roller 217 and is conveyed to the transfer unit 240 in time together with the toner image formed on the photosensitive drum 201 by a registration roller 218. Accordingly, an unfixed image 208 is transferred to the sheet 207, and the sheet 207 is conveyed to the fixing unit 250.

The fixing unit 250 includes a heating unit 250A that has a fixing heater 211 serving as a heating unit and heats the sheet 207 and a pressing unit 250B that is pressed against the heating unit 250A to press the sheet 207. The heating unit 250A includes: for example, the fixing heater 211 having a ceramic substrate, a heating layer, and a protective layer; a stay 212 that holds the fixing heater 211; a reinforcement member 213; and a thermistor 214 that detects the temperature of the fixing heater 211, which are covered with a fixing film 209. The pressing unit 250B is configured to include a pressing roller 210 that is pressed against the heating unit 250A by a spring or the like that is not illustrated. The above-configured fixing unit 250 fixes an unfixed image 208 to the sheet 207 by the heating by the fixing heater 211. Thereafter, the sheet 207 is conveyed from the fixing unit 250 to a sheet discharge roller 219 and is discharged to a sheet discharge unit 216.

Figure 2:
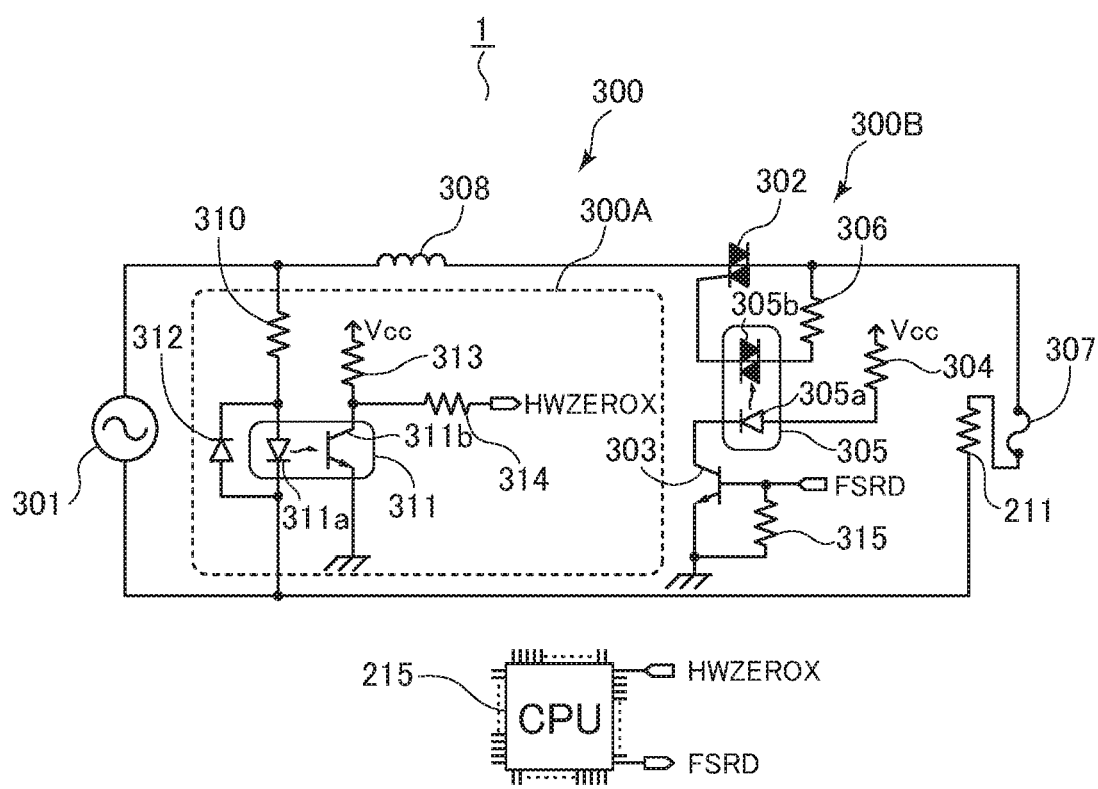
FIG. 2 is a circuit diagram illustrating an energization circuit and a control portion according to the first embodiment.

Next, configurations of an energization circuit 300 and a control portion 215 in an energization control device 1 according to the first embodiment will be described with reference to FIG. 2. The energization control device 1 according to the first embodiment includes the energization circuit 300 and the control portion 215 serving as a control portion. The energization circuit 300 is connected to the commercial power source 301, roughly has a zero-cross detection circuit unit 300A serving as a voltage detection unit and a power feeding circuit unit 300B, and executes energization control that is wave number control in which a half-wave unit of the commercial power source 301 is a unit of control.

The zero-cross detection circuit unit 300A includes resistors 310, 313, and 314, a diode 312, and a photocoupler 311, and outputs a HWZEROX signal, which will be described in detail below, to the control portion 215. Further, the power feeding circuit unit 300B includes a triac 302, a transistor 303, resistors 304, 306, and 315, a phototriac coupler 305, a fuse 307, and a coil 308. The power feeding circuit unit 300B supplies electric power of the commercial power source 301 to the fixing heater 211 by an FSRD signal from the control portion 215.

In the zero-cross detection circuit unit 300A, a current that is limited by the resistor 310 as an instantaneous value of the commercial power source 301 becomes higher is electrified to the photocoupler 311 while preventing an excessive reverse voltage from being applied to the photocoupler 311 by the diode 312. In the photocoupler 311, when a current value is sufficient for a light emitting-side diode 311a to emit light, a light receiving-side transistor 311b becomes conductive. As a result, the HWZEROX signal is changed from a level H serving as a first detection signal determined by a voltage Vcc generated by a power source that is not illustrated to a level L serving as a second detection signal. In contrast, in the photocoupler 311, when a current flowing through the light emitting-side diode 311a is insufficient, the light receiving-side transistor 311b becomes non-conductive, and the HWZEROX signal is changed from the level L to the level H.

On the other hand, in the power feeding circuit unit 300B, power supply from the commercial power source 301 to the fixing heater 211 is controlled using the triac 302 serving as a control element (a switching element for switching the power supply). The control portion 215 calculates a power supply amount to the fixing heater 211 based on a temperature detection result of the thermistor 214, and outputs the FSRD signal serving as an energization signal including an ON signal serving as a first energization signal or an OFF signal serving as a second energization signal according to the calculation signal. When the ON signal of the FSRD signal is input, the transistor 303 becomes conductive, and in the phototriac coupler 305, a light emitting-side diode 305a emits light, and a light receiving-side triac 305b becomes conductive. As the light receiving-side triac 305b becomes conductive, a gate current is supplied to the triac 302, the triac 302 becomes conductive, and electric power is supplied to the fixing heater 211. When the OFF signal of the FSRD signal is input, the transistor 303 is interrupted, and in the phototriac coupler 305, the light emitting-side diode 305a is turned off, and the light receiving-side triac 305b is interrupted at a next zero cross point of the commercial power source 301. As the light receiving-side triac 305b is interrupted, a gate current is not supplied to the triac 302, the triac 302 is interrupted, and thus the electric power is not supplied to the fixing heater 211.

The fuse 307 is, for example, a temperature fuse, and is an overheating protection element that prevents the temperature of the fixing heater 211 from being excessively raised. Further, the coil 308 suppresses switching noise generated when the triac 302 starts to be conductive from being emitted to the outside of the image forming apparatus.

Figure 3:
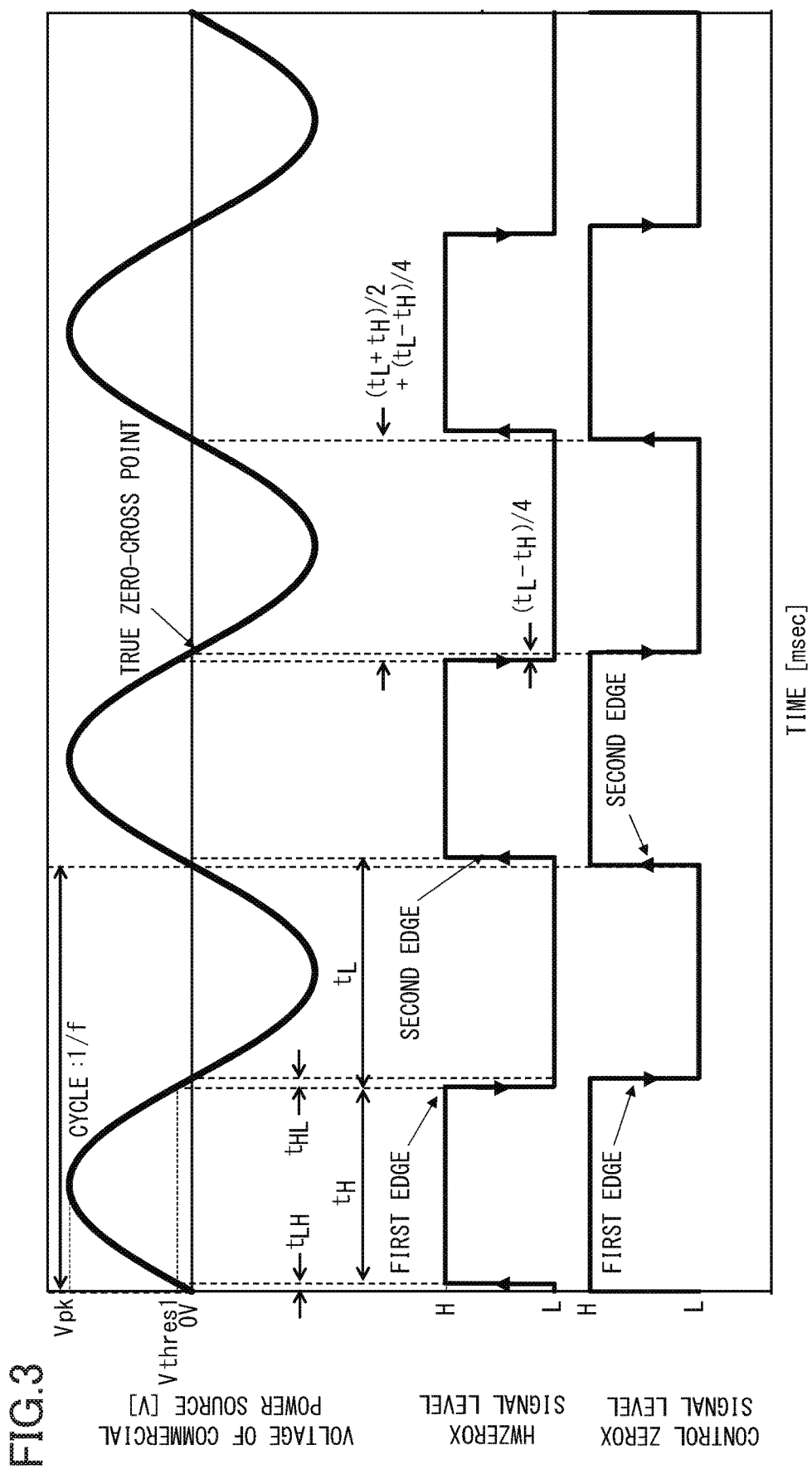
FIG. 3 is a time chart illustrating a relationship between a voltage of a commercial power source, a HWZEROX signal level, and a control ZEROX signal level according to the first embodiment.

Next, control of outputting a control ZEROX signal in accordance with a true zero-cross point in the first embodiment will be described with reference to FIGS. 3 to 5. A minimum voltage value required to turn on the photocoupler 311 is set as a threshold Vthres 1. Since a voltage does not occur when a current does not flow, the threshold Vthres 1 cannot be substantially set to 0. Further, in the HWZEROX signal, a first edge is transited from the level H to the level L when an instantaneous voltage value of the commercial power source 301 is lower than the threshold Vthres1, and a second edge is transited from the level L to the level H when the instantaneous voltage value is higher than the threshold Vthres 1. Further, $t_H$ denotes a period serving as a first period from the second edge to the first edge, and $t_L$ denotes a period serving as a second period from the first edge to the second edge.

Here, in a case where the instantaneous voltage value V(t=0) of the commercial power source 301 is, for example, 0 V which is a true zero-cross point, the instantaneous voltage value V(t) of the commercial power source 301, a peak voltage Vpk of the commercial power source 301, and a frequency f of the commercial power source 301 at a time t can be expressed by Equation (1).

$$V(t)=V_{pk} \cdot \sin(2\pi f t) \qquad \text{Equation (1)}$$

From Equation (1), V(t)=Vthres1 from the true zero-cross point, and a period $t_{LH}$ until the second edge of the HWZEROX signal is obtained is expressed by Equation (2).

$$t_{LH}=(1/2\pi f) \cdot \sin^{-1}(V_{thres1}/V_{pk}) \qquad \text{Equation (2)}$$

Further, since a period $t_{HL}$ from the first edge of the HWZEROX signal to the next true zero-cross point is equal to the period $t_{LH}$, a period $t_H$ and a period $t_L$ are expressed by Equation (3) and Equation (4).

$$t_H=1/2f-(t_{HL}+t_{LH})$$

$$t_H=1/2f-(1/\pi f) \cdot \sin^{-1}(V_{thres1}/V_{pk}) \qquad \text{Equation (3)}$$

$$t_L=1/2f+(t_{HL}+t_{LH})$$

$$t_L=1/2f+(1/\pi f) \cdot \sin^{-1}(V_{thres1}/V_{pk}) \qquad \text{Equation (4)}$$

Further, a difference between the period $t_H$ and the period $t_L$ is a value that is twice the total value of the period $t_{HL}$ and the period $t_{LH}$, and when the period $t_{HL}$ is equal to the period $t_{LH}$, Equation (5) is satisfied.

$$t_L-t_H=(2/\pi f) \cdot \sin^{-1}(V_{thres1}/V_{pk}) \qquad \text{Equation (5)}$$

In Equation (5), it can be seen that $t_L-t_H=2t_{HL}+2t_{LH}$ is satisfied, that is, a quarter of the difference between the period $t_H$ and the period $t_L$ is equal to the period $t_{HL}$ or the period $t_{LH}$. Therefore, as indicated by Equation (6), in a case where the first edge of the HWZEROX signal is set as a starting point while a first correction value is set as a quarter of the difference of Equation (5), the next true zero-cross point following the first edge can be calculated.

$$\text{First correction value}=(t_L-t_H)/4$$

$$\text{First correction value}=(1/2\pi f) \cdot \sin^{-1}(V_{thres1}/V_{pk}) \qquad \text{Equation (6)}$$

Further, as can be identified from Equation (3) and Equation (4), a value obtained by adding the period $t_H$ to the period $t_L$ is equal to a time of one cycle of the commercial power source 301. Therefore, as indicated by Equation (7), in a case where the first edge of the HWZEROX signal is set as a starting point while a second correction value is set to the total value of a half of the one cycle and the first correction value, the one after the next true zero-cross point can be calculated.

$$\text{Second correction value}=\text{First correction value}+(t_L+t_H)/2$$

$$\text{Second correction value}=(1/2\pi f) \cdot \sin^{-1}(V_{thres1}/V_{pk})+1/2f \qquad \text{Equation (7)}$$

The first edge when the control ZEROX signal is transited from the level H to the level L is a first reference timing (correction timing) after time elapse of the first correction value calculated from a sine wave of the commercial power source 301 before one cycle from the first edge of the HWZEROX signal. Further, the second edge when the control ZEROX signal is transited from the level L to the level H is a second reference timing after time elapse of the second correction value calculated from the sine wave of the commercial power source 301 before the one cycle from the first edge of the HWZEROX signal As can be seen from Equation (6) and Equation (7), both the first correction value and the second correction value are values corresponding to changes in the peak voltage Vpk and the frequency f or the threshold Vthres1 of the commercial power source 301. Therefore, a timing of the next true zero-cross point and the one after the next zero-cross point following the first edge can be calculated from the first edge of the HWZEROX signal.

Figure 4:
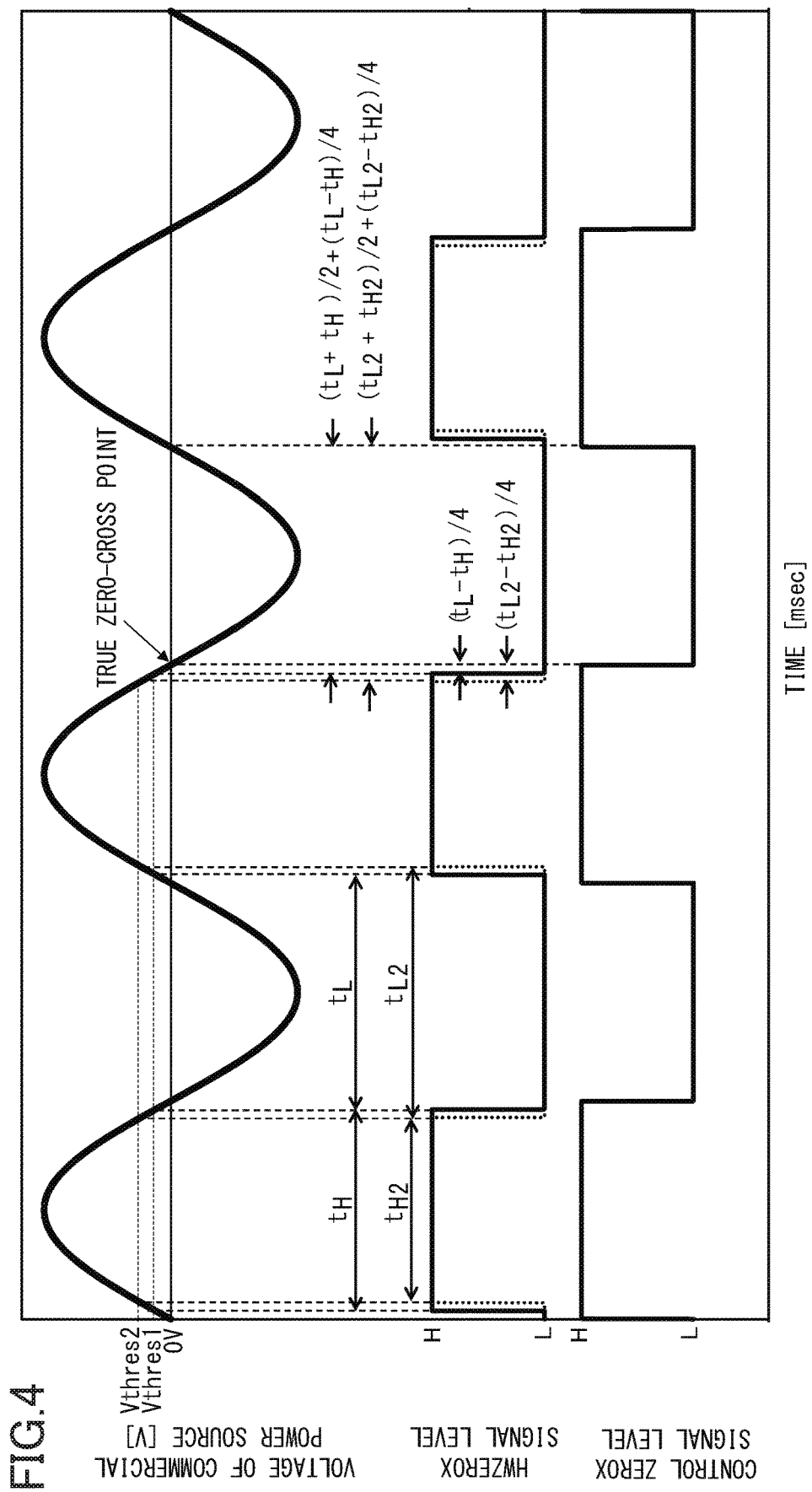
FIG. 4 is a time chart illustrating a relationship between the voltage of the commercial power source, the HWZEROX signal level, and the control ZEROX signal level when a threshold is different in the first embodiment.

Next, FIG. 4 illustrates examples of the HWZEROX signal and the control ZEROX signal in a case where the threshold Vthres1 is changed to a threshold Vthres2. Here, a dotted line indicates the HWZEROX signal at the threshold Vthres2, a period from the first edge to the second edge at the threshold Vthres2 is set as a period $t_{L2}$, and a period from the second edge to the first edge is set as a period $t_{H2}$. With respect to the commercial power source 301, the period $t_{L2}$ and the period $t_{H2}$ have different values from the period $t_L$ and the period $t_H$, respectively, depending on the difference between the thresholds.

However, as described above, the first correction value and the second correction value are calculated by a quarter of a difference between the period $t_{L2}$ and the period $t_{H2}$. Accordingly, a timing of the first edge and the second edge of the control ZEROX signal with respect to a timing of the first edge and the second edge of the HWZEROX signal at the threshold value Vthres2 becomes a timing of the true zero-cross point of the commercial power source 301.

Figure 5:
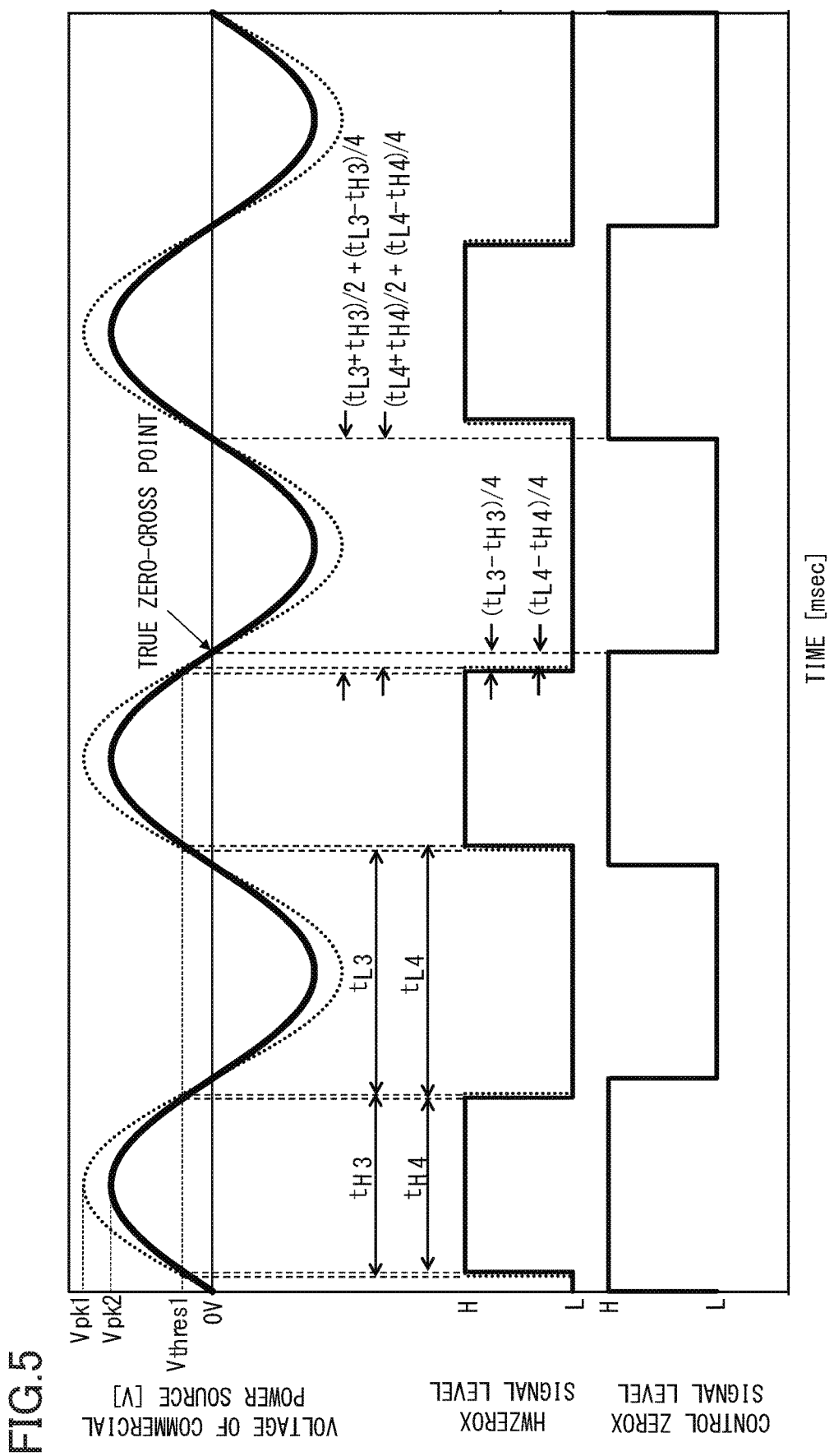
FIG. 5 is a time chart illustrating a relationship between the voltage of the commercial power source, the HWZEROX signal level, and the control ZEROX signal level when the voltage of the commercial power source is different in the first embodiment.

Next, FIG. 5 illustrates examples of the HWZEROX signal and the control ZEROX signal in a case where the voltage of the commercial power source 301 is different. In FIG. 5, the voltage waveform and the HWZEROX signal waveform in the case of the peak voltage Vpk1 of the commercial power source 301 are expressed by dotted lines, and the voltage waveform and the HWZEROX signal waveform in the case of a peak voltage Vpk2 are expressed by solid lines. In the case of the peak voltage Vpk1, a period from the first edge to the second edge is set as a period $t_{L3}$, and a period from the second edge to the first edge is set as a period $t_{H3}$. In the case of the peak voltage Vpk2, a period from the first edge to the second edge is set as a period $t_{L4}$, and a period from the second edge to the first edge is set as a period $t_{H4}$. The period $t_{L3}$ and the period $t_{H3}$ are different from the period $t_{L4}$ and the period $t_{H4}$ due to a difference in the voltage of the commercial power source 301.

However, as in a case where the threshold Vthres1 is changed as described above, even in a case where the voltage of the commercial power source 301 is different, the first correction value and the second correction value are calculated by a quarter of the difference between the period $t_{L2}$ and the period $t_{H2}$. Accordingly, a timing of the first edge and the second edge of the control ZEROX signal becomes a timing of the true zero-cross point of the commercial power source 301.

Figure 6:
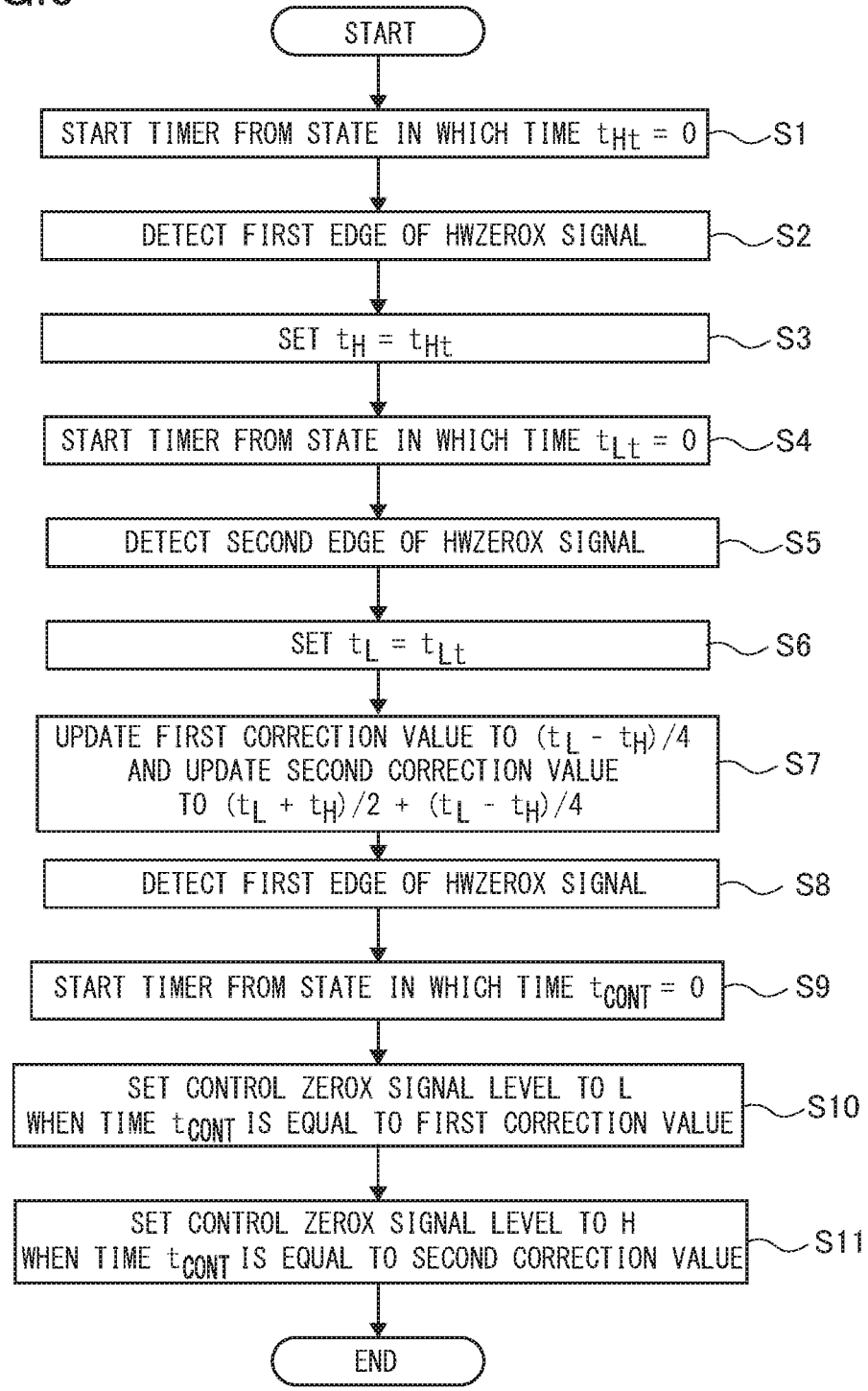
FIG. 6 is a flowchart illustrating generation control of the control ZEROX signal according to the first embodiment.

Next, control of the control ZEROX signal based on the HWZEROX signal by the energization control device 1 will be described using FIG. 6. When starting main control, the control portion 215 sets, for example, zero, to an initial value of each of the first correction value and the second correction value, and sets H to an initial value of the control ZEROX signal. Thereafter, the control of FIG. 6 is repeated whenever the second edge of the HWZEROX signal is detected.

The control portion 215 starts a timer from a state in which a timer time $t_{Ht}$ is zero from a time point when the second edge of the HWZEROX signal is detected (S1), and when the first edge of the HWZEROX signal is detected (S2), sets the timer time $t_{Ht}$ at that time point as a period $t_H$ (S3). That is, the period $t_H$ during which the HWZEROX signal is at the level H from a time point when the second edge is detected to a time point when the first edge is detected is measured.

Further, when the first edge of the HWZEROX signal is detected (S2), the timer is started from a state in which the timer time $t_{Lt}$ is zero (S4), and when the second edge of the HWZEROX signal is detected (S5), the timer time $t_{Lt}$ at that time point is set as the period $t_L$ (S6). That is, the period $t_L$ during which the HWZEROX signal is at the level L from a time point when the first edge is detected to a time point when the second edge is detected is measured.

Subsequently, a value of a quarter of a difference between the measured period $t_H$ and the measured period $t_L$ is set as a first correction value, and a value obtained by adding a quarter of the difference between the measured period $t_H$ and the measured period $t_L$ to a half of the total of the measured period $t_H$ and the measured period $t_L$ is updated as the second correction value (S7). Next, when the first edge of the HWZEROX signal is detected (S8), the timer is started from a state in which a timer time $t_{CONT}$ is zero (S9), a time point when the timer time $t_{CONT}$ is equal to the first correction value is set as a first reference timing, and the control ZEROX signal is set from H to L (S10). Further, a time point when the timer time $t_{CONT}$ is the second correction value is set as a second reference timing, and the control ZEROX signal is set from L to H (S11).

Then, the control portion 215 switches a drive timing of the on/off signal of the FSRD signal with reference to the first reference timing and the second reference timing of the control ZEROX signal. Accordingly, the triac 302 can be conducted/interrupted near the true zero-cross point of the commercial power source 301. Further, as described with reference to FIGS. 4 and 5, the first reference timing and the second reference timing of the control ZEROX signal can be set as a timing near the true zero-cross point of the commercial power source 301 without being affected by a change in the threshold and a variation in the voltage of the commercial power source 301.

In the above-described control illustrated in FIG. 6, it has been described that the control ZEROX signal is generated by calculating and correcting the first correction value and the second correction value with respect to the first edge of the HWZEROX signal, and the drive timing of the on/off signal of the FSRD signal is controlled. However, the first edge of the control ZEROX signal may be determined by correcting the first edge of the HWZEROX signal by the first correction value, and in addition, the second edge of the control ZEROX signal may be determined by managing a period of a half cycle with the timer or the like. That is, when only the first correction value can be calculated as a correction value, the control ZEROX signal can be generated using the timer or the like, and the drive timing of the on/off signal of the FSRD signal can be controlled at the timing near the true zero-cross point.

Further, in the first embodiment, the first correction value and the second correction value are calculated from the period $t_H$ and the period $t_L$ in a shortly previous cycle of the commercial power source 301. However, the present invention is not limited thereto. The same effect can be obtained both when using an average value of each of the period $t_H$ and the period $t_L$ over a plurality of cycles or when using average values of the first correction value and the second correction value over a plurality of cycles. Further, the transition of the HWZEROX signal from the level L to the level H may correspond to the first edge, and the transition of the HWZEROX signal from the level H to the level L may correspond to the second edge. In this case, even when a value obtained by adding the period $t_H$ to a quarter of the difference of Equation (5) is set as the first correction value, the conduction/interruption of the triac can be controlled near the true zero-cross point of the commercial power source.

Further, it has been described in the first embodiment that when the voltage of the commercial power source 301 is positive (plus), electric power is supplied to the fixing heater 211. However, in contrast, when the voltage of the commercial power source 301 is negative (minus), the electric power may be supplied to the fixing heater 211. That is, in the above description, the control ZEROX signal is set from H to L at a correction timing obtained by correcting, with the first correction value, the timing of the first edge. However, in a case where the electric power is supplied to the fixing heater 211 when the voltage of the commercial power source 301 is negative, the control ZEROX signal is set from H to L at a timing obtained by adding a half cycle to the correction timing obtained by correcting, with the first correction value, the timing of the first edge. Further, the same is applied to a case where the transition of the HWZEROX signal from the level L to the level H is the first edge, the transition of the HWZEROX signal from the level H to the level L is the second edge, and the electric power is supplied to the fixing heater 211 when the voltage of the commercial power source 301 is negative.

As described above, according to the energization control device 1 according to the first embodiment, first, the zero-cross detection circuit unit 300A outputs the HWZEROX signal (pulse signal) having the level H when the voltage of the commercial power source 301 is higher than the threshold Vthres1 and outputs the HWZEROX signal having the level L when the voltage of the commercial power source 301 is lower than the threshold Vthres1. Then, the control portion 215, which receives input of the HWZEROX signal, calculates the first correction value $((t_L-t_H)/4)$ from a difference between the period $t_H$ during which the HWZEROX signal having the level H is input and the period $t_L$ during which the HWZEROX signal having the level L is input. Then, at the correction timing obtained by correcting, with the first correction value, a timing of the first edge at which the HWZEROX signal is switched between the level H and the level L, the control ZEROX signal is switched between the level H and the level L, and the FSRD signal which is turned on/off based on the switching is output. Accordingly, in the power feeding circuit unit 300B that receives input of the FSRD signal, the fixing heater 211 is electrically switched on/off near the true zero-cross point. Thus, the conduction/interruption of the triac 302 can be controlled near the true zero-cross point of the commercial power source without being affected by a change in the voltage of the commercial power source or the frequency and a variation in the threshold of the zero-cross detection circuit unit 300A.

Second Embodiment

Next, a second embodiment, obtained by partially changing the first embodiment, will be described with reference to FIGS. 7 to 10. In description of the second embodiment, same components as those in the first embodiment will be designated by the same reference numerals, and description thereof will be omitted.

Figure 7:
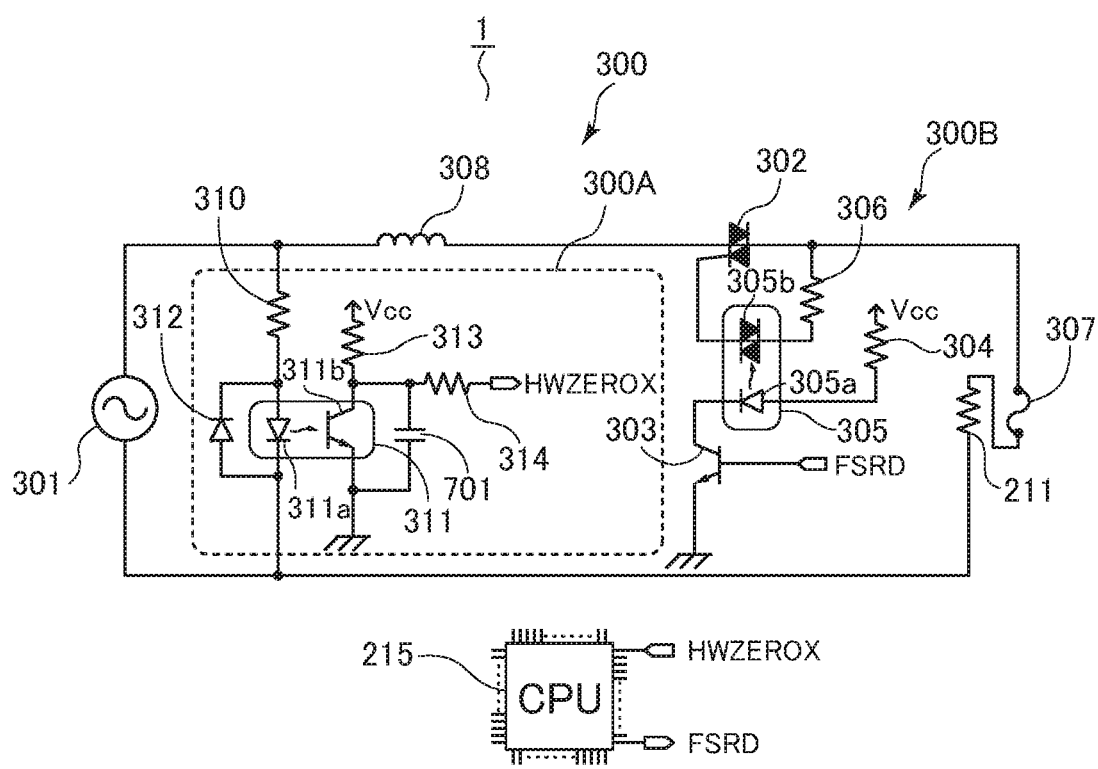
FIG. 7 is a circuit diagram illustrating an energization circuit and a control portion according to a second embodiment.

In the second embodiment, as compared with the first embodiment, the zero-cross detection circuit unit 300A of the energization circuit 300 illustrated in FIG. 7 has a capacitor 701 serving as a bypass capacitor connected in parallel to the photocoupler 311. That is, the capacitor 701 is provided to prevent malfunction of the HWZEROX signal By installing the capacitor 701, the first edge and the second edge of the HWZEROX signal have a time constant τ due to the capacitor 701 and the resistor 313.

Figure 8:
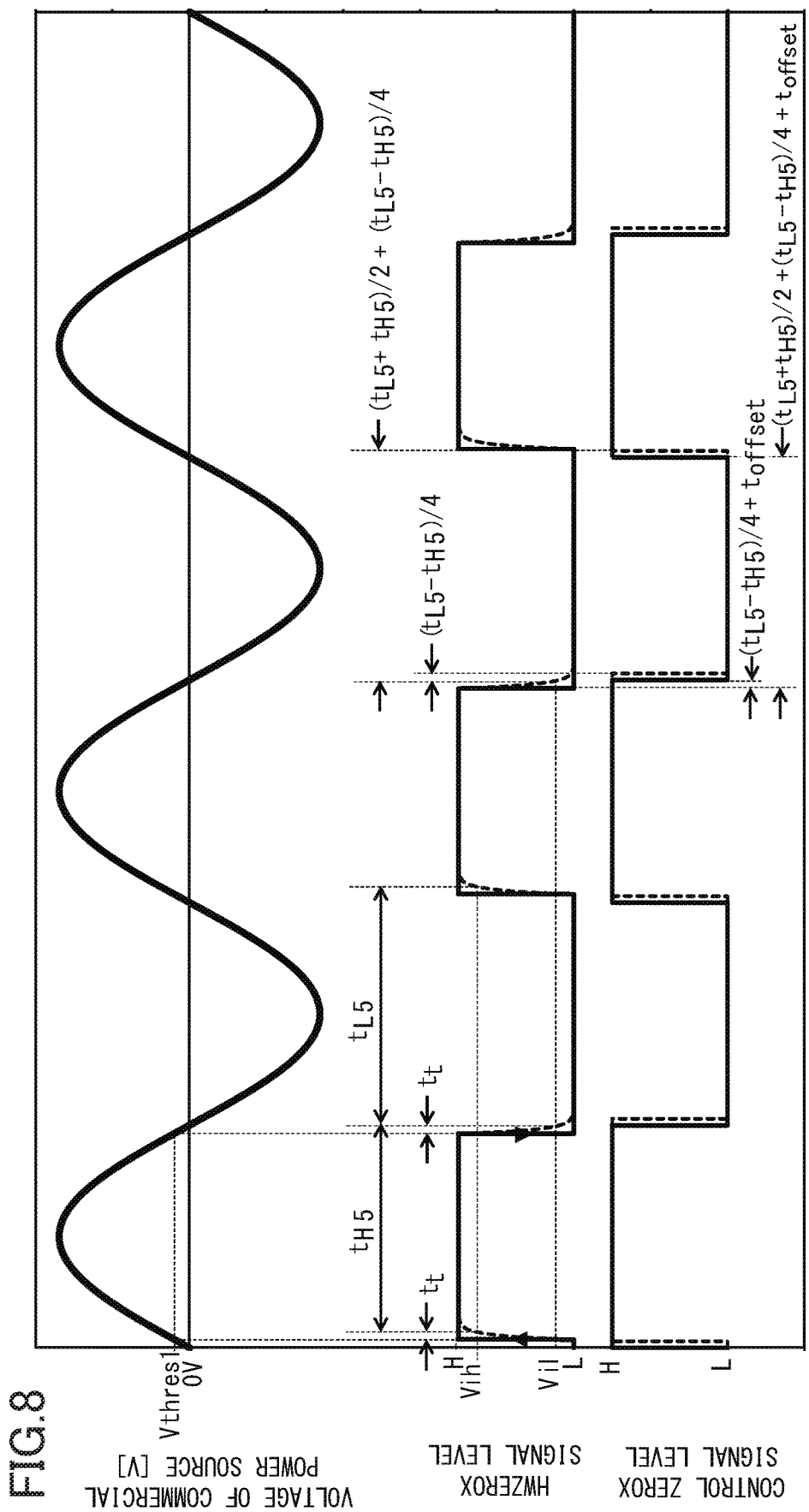
FIG. 8 is a time chart illustrating a relationship between the voltage of the commercial power source, the HWZEROX signal level, and the control ZEROX signal level according to the second embodiment.

In FIG. 8, the HWZEROX signal in a case where capacitor 701 is not provided is indicated by a solid line, and the HWZEROX signal in a case where the capacitor 701 is provided is indicated by a dotted line. Here, a threshold Vih and a threshold Vil are thresholds with which the control portion 215 detects the level H and the level L of the HWZEROX signal, respectively. In the second embodiment, the threshold Vih=Vcc×0.8, and the threshold Vil=Vcc×0.2.

Since the first edge and the second edge of the HWZEROX signal have the same time constant τ, a period from the level L to the threshold Vih and a period from the level H to the threshold Vil are equal to $t_r$. Therefore, a period $t_{L5}$ from the first edge to the second edge and a period $t_{H5}$ from the second edge to the first edge are not affected by the time constant τ. However, with respect to the first edge of the HWZEROX signal, in a case where the first reference value and the second reference value calculated from the first correction value and the second correction value are set as the control ZEROX signal, which is similar to those according to the first embodiment, a deviation due to the time constant τ occurs. Therefore, the control ZEROX signal is indicated by the dotted line of FIG. 8. In a case where the FSRD signal is output with reference to the control ZEROX signal having the deviation, the triac 302 is conducted/interrupted at a timing deviated from the true zero-cross point by the time constant τ, which leads to an increase in switching noise.

Thus, in the second embodiment, in order to suppress the deviation due to the time constant τ, the correction value is calculated by Equation (8) and Equation (9).

Third correction value=$(t_L-t_H)/4+t_{offset}$     Equation (8)

Fourth correction value=Third correction value+$(t_L+t_H)/2$     Equation (9)

Here, a fixed value $t_{offset}$ is a fixed value for correction, and is −tτ in the second embodiment. Since time constant τ is uniquely determined by a circuit constant, the time constant τ is not affected by the threshold Vthres1 and the commercial power source 301. Thus, timings of the next true zero-cross point and the one after the next zero-cross point following the first edge can be calculated from the first edge of the HWZEROX signal by the third correction value and the fourth correction value.

Figure 9:
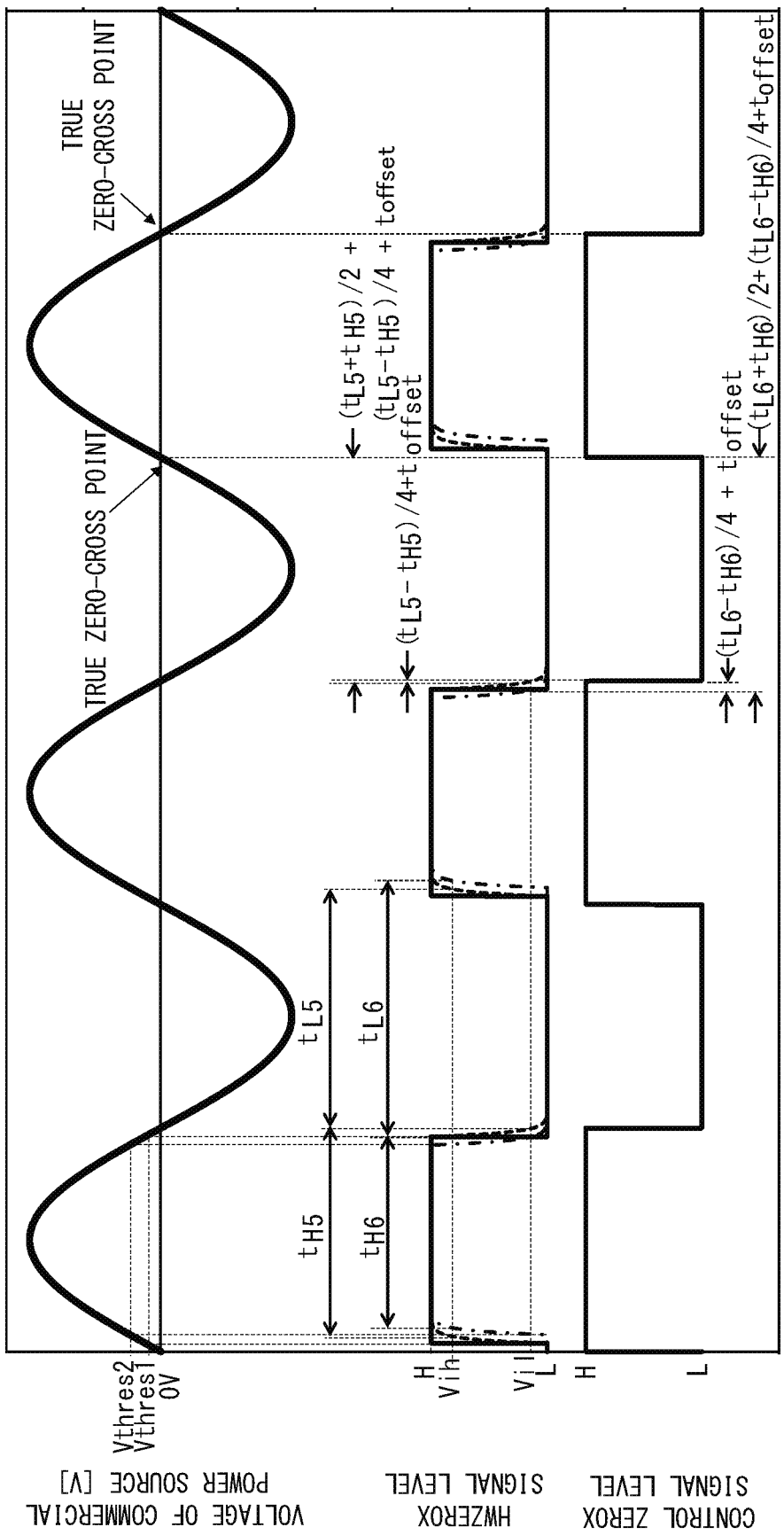
FIG. 9 is a time chart illustrating a relationship between the voltage of the commercial power source, the HWZEROX signal level, and the control ZEROX signal level when the voltage of the commercial power source is different in the second embodiment.

FIG. 9 illustrates examples of the HWZEROX signal and the control ZEROX signal having the time constant τ in a case where the threshold Vthres 1 is changed. The HWZEROX signal indicated by a dotted line in FIG. 9 is the HWZEROX signal at the threshold Vthres1, and the HWZEROX signal indicated by a one-dot chain line is the HWZEROX signal at the threshold Vthres2. Similar to the first embodiment, a period from the first edge to the second edge of the HWZEROX signal at the threshold Vthres1 is set as a period $t_{H5}$, and a period from the second edge to the first edge of the HWZEROX signal at the threshold Vthres1 is set as a period $t_{L5}$. Further, a period from the first edge to the second edge of the HWZEROX signal at the threshold Vthres2 is set as a period $t_{H6}$, and a period from the second edge to the first edge of the HWZEROX signal at the threshold Vthres2 is set as a period $t_{L6}$. As described above, the period from the first edge to the second edge of the HWZEROX signal and the period from the second edge to the first edge of the HWZEROX signal have values that are different depending on changes in the threshold Vthres 1 and the threshold Vthres2.

On the other hand, the deviation due to the time constant τ with respect to the first edge of the HWZEROX signal is corrected by the fixed value $t_{offset}$ regardless of the threshold Vthres1 and the threshold Vthres2. As a result, as the first and second edges of the control ZEROX signal are corrected by the third correction value and the fourth correction value, the corrected first and second edges are closer to the true zero-cross point of the commercial power source 301 than the first and second edges corrected by the first correction value and the second correction value, and the influence of the time constant τ is suppressed. In the second embodiment, although a relationship between the HWZEROX signal and the control ZEROX signal when the threshold Vthres 1 is changed is described, the same effect can be obtained even when the voltage of the commercial power source 301 is changed.

Next, according to the energization control device 1 according to the second embodiment, control of the control ZEROX signal based on the HWZEROX signal will be described with reference to FIG. 10. In the second embodiment, as compared to the control (see FIG. 6) of the first embodiment, the calculation of the third correction value and the fourth correction value (S101) and the timing of the control ZEROX signal based on the calculation (S102, S103) are different.

Figure 10:
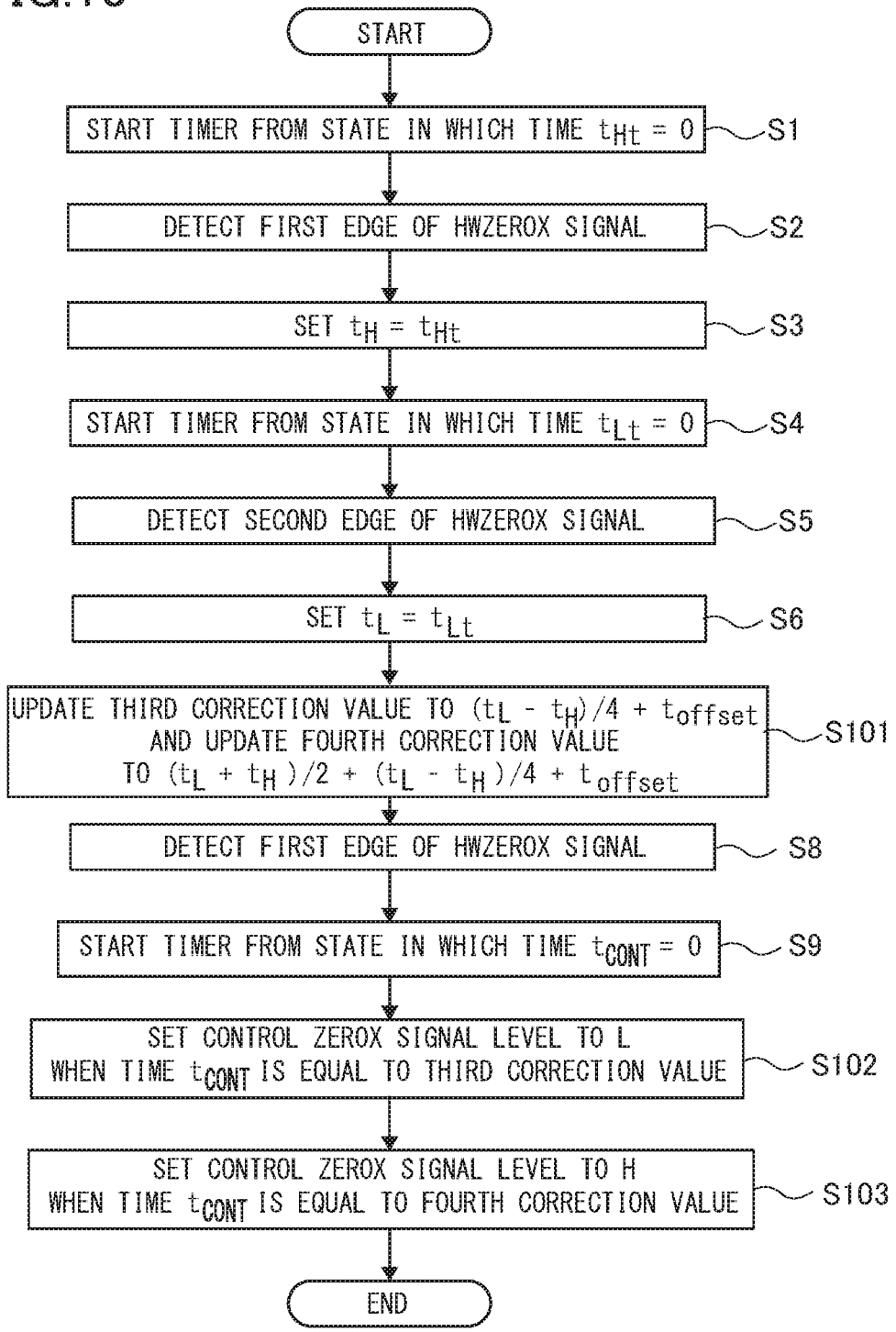
FIG. 10 is a flowchart illustrating generation control of the control ZEROX signal according to the second embodiment.
Figure 11:
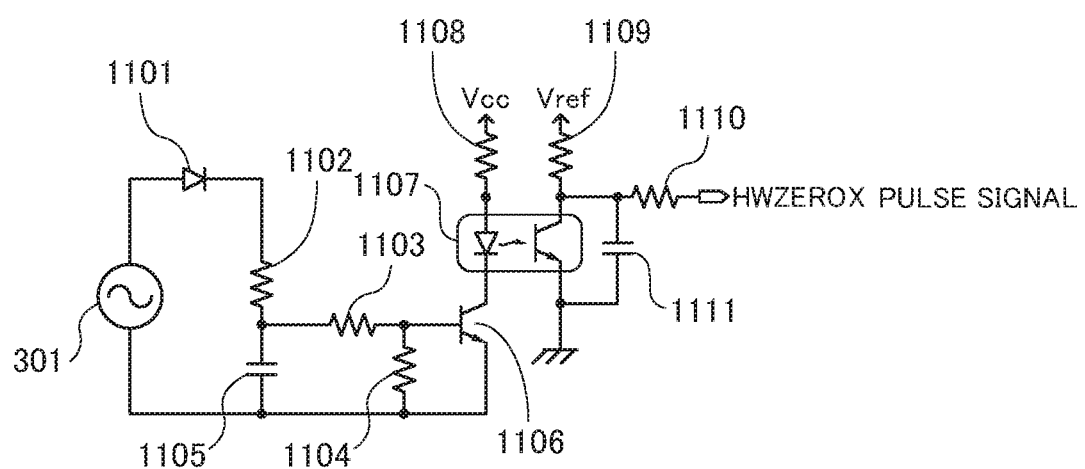
FIG. 11 is a circuit diagram illustrating a general zero-cross detection circuit.
Figure 12:
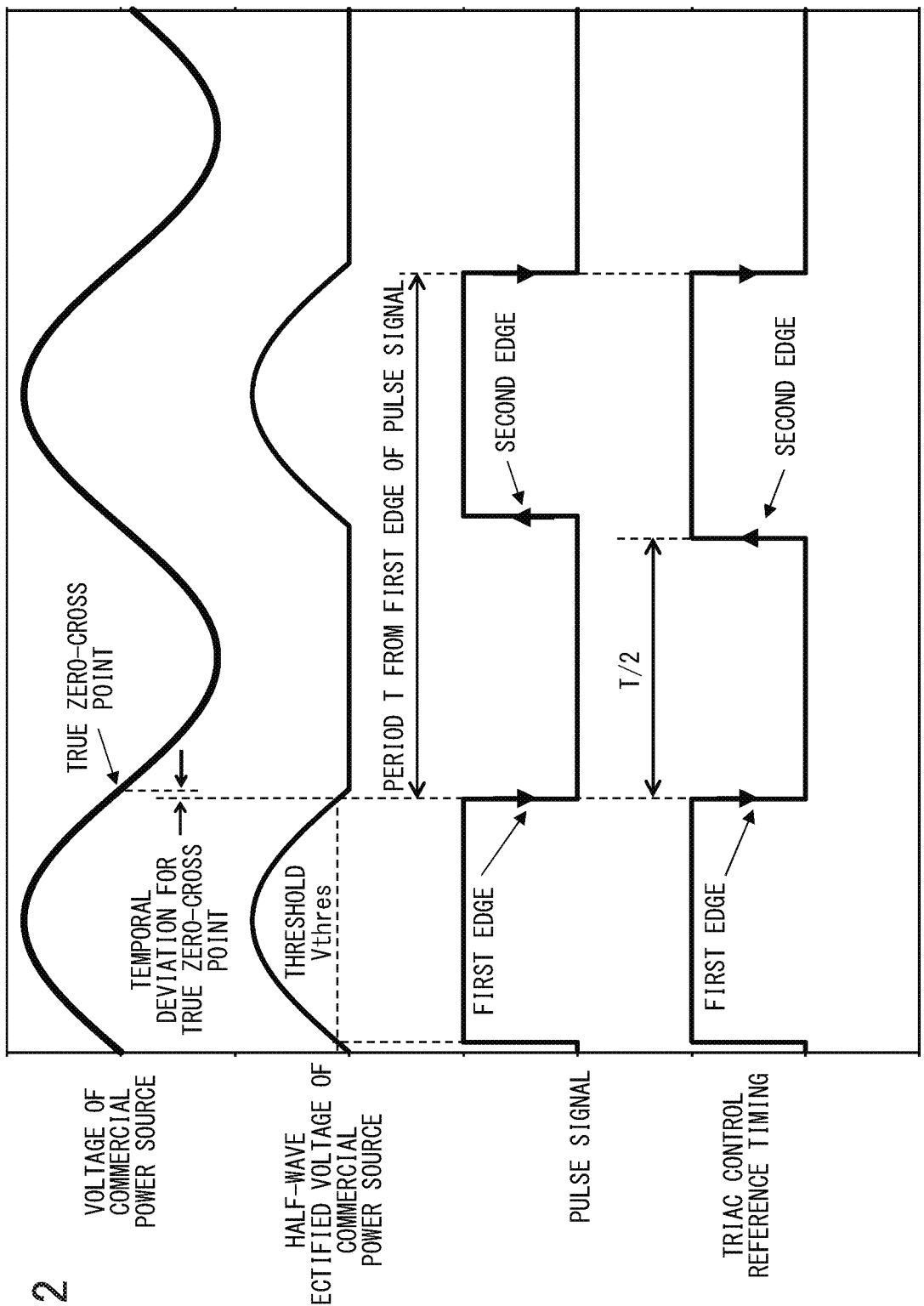
FIG. 12 is a time chart illustrating a relationship between the voltage of the commercial power source, a half-wave rectified voltage value of the commercial power source, a pulse signal, and a triac control reference timing according to the related art.
Figure 13:
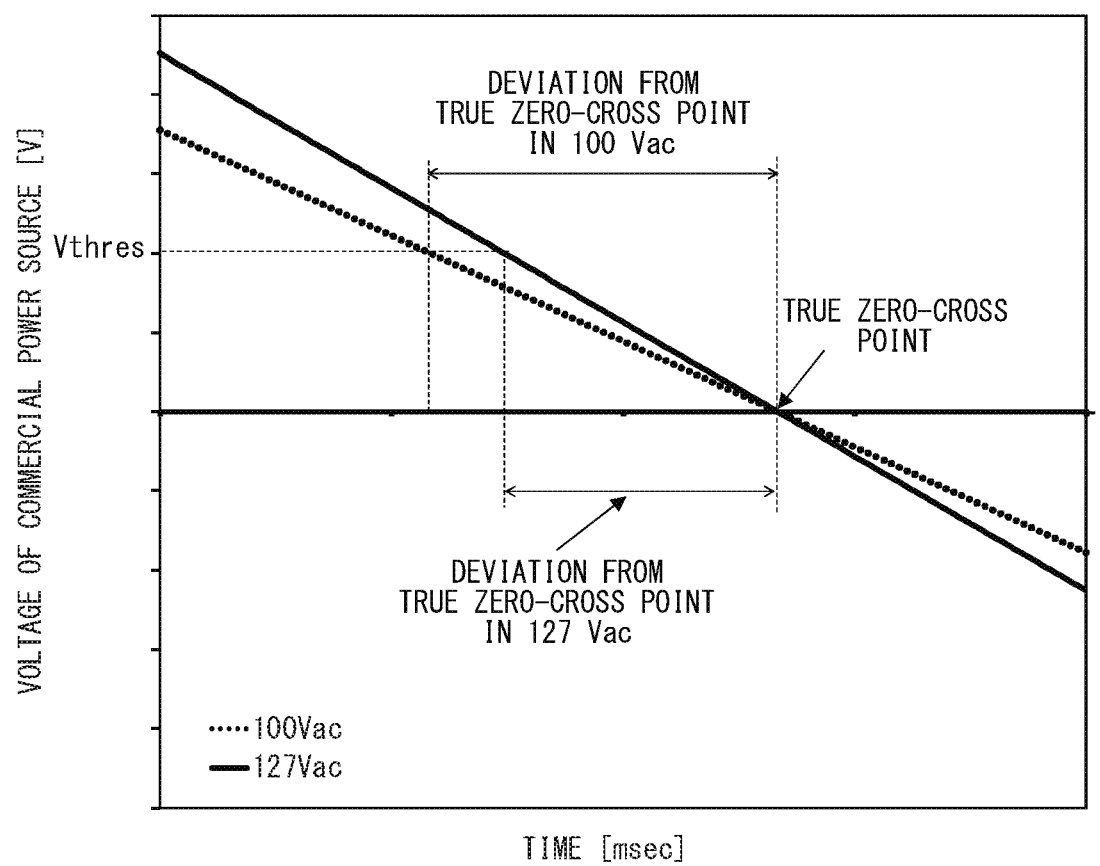
FIG. 13 is a timing chart illustrating a relationship between the voltage of the commercial power source, a true zero-cross point, and a time deviation amount.

In detail, when starting this control, the control portion 215 sets, for example, zero as an initial value of each of the third correction value and the fourth correction value, and sets H as an initial value of the control ZEROX signal Thereafter, the control of FIG. 10 is repeated whenever the second edge of the HWZEROX signal is detected.

The control portion 215 starts a timer from a state in which the timer time $t_{Ht}$ is zero from a time point when the second edge of the HWZEROX signal is detected (S1), and when the first edge of the HWZEROX signal is detected (S2), sets the timer time $t_{Ht}$ at that time point as the period $t_H$ (S3). That is, the period $t_H$ during which the HWZEROX signal is at the level H from a time point when the second edge is detected to a time point when the first edge is detected is measured.

Further, when the first edge of the HWZEROX signal is detected (S2), the timer is started from a state in which the timer time $t_{Lt}$ is zero (S4), and when the second edge of the HWZEROX signal is detected (S5), the timer time $t_{Lt}$ at that time point is set as the period $t_L$ (S6). That is, the period $t_L$ during which the HWZEROX signal is at the level L from the time point when the first edge is detected to the time point when the second edge is detected is measured.

Subsequently, a value obtained by adding the fixed value $t_{offset}$ to a value of a quarter of the difference between the measured period $t_H$ and the measured period $t_L$ is update as the third correction value. Further, a value obtained by adding the quarter of the difference between the measured period $t_H$ and the measured period $t_L$ and the fixed value $t_{offset}$ to a half (half cycle) of the total of the measured period $t_H$ and the measured period $t_L$ is updated as the fourth correction value (S101). Next, when the first edge of the HWZEROX signal is detected (S8), the timer is started from a state in which the timer time $t_{CONT}$ is zero (S9), a time point when the timer time $t_{CONT}$ is equal to the third correction value is set as the first reference timing, and the control ZEROX signal is set from H to L (S102). Further, a time point when the timer time $t_{CONT}$ is the fourth correction value is set as the second reference timing, and the control ZEROX signal is set from L to H (S103).

Then, the control portion 215 switches the drive timing of the on/off signal of the FSRD signal with reference to the first reference timing and the second reference timing of the control ZEROX signal. Accordingly, the triac 302 can be conducted/interrupted near the true zero-cross point of the commercial power source 301. Further, as described with reference to FIG. 9, the first reference timing and the second reference timing of the control ZEROX signal can be set as the timings near the true zero-cross point of the commercial power source 301 without being affected by the change in the threshold and the variation in the voltage of the commercial power source 301.

In the control described above with reference to FIG. 10, it has been described that the control ZEROX signal is generated by calculating and correcting the third correction value and the fourth correction vale with respect to the first edge of the HWZEROX signal, and the drive timing of the on/off signal of the FSRD signal is controlled. However, the first edge of the control ZEROX signal may be determined by correcting the first edge of the HWZEROX signal with the third correction value, and in addition, the second edge of the control ZEROX signal may be determined by managing the period of the half cycle with the timer or the like. That is, when only the third correction value can be calculated as the correction value, the control ZEROX signal can be generated with the timer or the like, and the drive timing of the on/off signal of the FSRD signal can be controlled at the timing near the true zero-cross point.

Further, in the second embodiment, the third correction value and the fourth correction value are calculated from the period $t_H$ and the period $t_L$ in the shortly previous cycle of the commercial power source 301. However, the present invention is not limited thereto. The same effect can be obtained both when using the average value of each of the period $t_H$ and the period $t_L$ over a plurality of cycles or when using the average values of the third correction value and the fourth correction value over a plurality of cycles. Further, the transition of the HWZEROX signal from the level L to the level H may correspond to the first edge, and the transition of the HWZEROX signal from the level H to the level L may correspond to the second edge. In this case, the conduction/interruption of the triac near the true zero-cross point of the commercial power source can be controlled even by setting the value obtained by adding the period $t_H$ to the quarter of the difference between the period $t_H$ and the period $t_L$ as the third correction value.

Since the other configurations, operations, and effects of the second embodiment are the same as those of the first embodiment, description thereof will be omitted.

As described above, according to the present invention, the temporal deviation with respect to the zero-cross point in the energization control can be corrected, and the switching noise can be reduced. Further, a circuit for full-wave rectifying the voltage of the commercial power source and a circuit for detecting the voltage of the commercial power source cannot be required, and thus an increase in costs can be prevented.

In the above-described first and second embodiments, it has been described that the energization of the fixing heater 211 is controlled by the energization control device 1. However, the present invention is not limited thereto. For example, any object may be to be electrified as in the energization control of the motor in the image forming apparatus 200.

Further, in the first and second embodiments, it has been described that in the zero-cross detection circuit unit 300A, the photocoupler 311 is used as a switching element. However, the present invention is not limited thereto. For example, any switching element, such as a photo-interrupter, which can output a signal having a different level according to a threshold, may be used.

Further, in the first and second embodiments, a laser printer having the fixing unit 250 as an image forming apparatus has been described as an example. However, the present invention is not limited thereto. For example, any object such as an inkjet printer may be to be electrified as long as the object is an image forming apparatus having a heater and a motor.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-130429, filed Jul. 12, 2019, which is hereby incorporated by reference herein in its entirety.

What is claimed is:

1. An energization control device to execute energization control for an energization object included in an image forming apparatus, the energization control device comprising:
   a zero-cross detection unit connected to a commercial power source and including a switching element configured to output a first detection signal if a voltage of the commercial power source is higher than a threshold and output a second detection signal if the voltage is lower than the threshold;
   a control portion to which the first detection signal and the second detection signal are input from the zero-cross detection unit, configured to generate a control zero-cross signal, and configured to output an energization signal on the basis of the control zero-cross signal; and
   an energization switching unit connected to the commercial power source and configured to switch electric power supply of the commercial power source to the energization object in accordance with the energization signal,
   wherein the control portion is configured to obtain a correction value based on a difference between a first period in which the first detection signal is input to the control portion and a second period in which the second detection signal is input to the control portion and to correct the control zero-cross signal with the correction value.

2. The energization control device according to claim 1, wherein the control portion is configured to set a timing of switching from the first detection signal to the second detection signal as a first edge and set a timing of switching from the second detection signal to the first detection signal as a second edge, and
   wherein the control portion is configured to output the energization signal at a correction timing obtained by adding the correction value to the timing of the first edge or at a timing when a half of a period obtained by adding the first period and the second period is elapsed from the correction timing.

3. The energization control device according to claim 2, wherein the control portion is configured to obtain a quarter of the difference between the first period and the second period as the correction value.

4. The energization control device according to claim 2, wherein the zero-cross detection unit comprises a bypass capacitor connected in parallel to the switching element, and
   wherein the control portion is configured to obtain a value obtained by adding a quarter of the difference between the first period and the second period to a fixed value according to a time constant defined by the bypass capacitor as the correction value.

5. The energization control device according to claim 1, wherein the control portion is configured to set a timing of switching from the second detection signal to the first detection signal as a first edge and set a timing of switching from the first detection signal to the second detection signal as a second edge, and
   wherein the control portion is configured to output the energization signal at a correction timing obtained by adding the first period and the correction value to the timing of the first edge or at a timing when a half of a period obtained by adding the first period and the second period is elapsed from the correction timing.

6. The energization control device according to claim 5, wherein the control portion is configured to obtain a quarter of the difference between the first period and the second period as the correction value.

7. The energization control device according to claim 5, wherein the zero-cross detection unit comprises a bypass capacitor connected in parallel to the switching element, and
   wherein the control portion is configured to obtain a value obtained by adding a quarter of the difference between the first period and the second period to a fixed value according to a time constant defined by the bypass capacitor as the correction value.

8. The energization control device according to claim 1, wherein the energization control is wave number control in which a unit of half-wave of the commercial power source is used as a unit of control, and
   wherein a triac is used as a control element of the energization switching unit.

9. An image forming apparatus comprising:
   a transfer unit configured to transfer an image to a sheet;
   a fixing portion comprising a heating unit that generates heat by being energized to heat the sheet to fix the image transferred by the transfer unit; and
   the energization control device according to claim 1,
   wherein the energization object is the heating unit.

10. An image forming apparatus for forming a toner image on a sheet comprising:
    a fixing portion configured to fix the toner image to the sheet, the fixing portion including a heater for heating the toner image;
    a zero-cross detection circuit configured to detect a zero-cross of a commercial power source, the zero-cross detection circuit outputting pulse signal having a first level H which is a level when a voltage of the commercial power source is higher than a threshold and a second level L which is a level when the voltage of the commercial power source is lower than the threshold;

an energization switching element connected to the commercial power source and configured to switch electrical power supplied to the heater based on an energization signal; and a control portion configured to output the energization signal to the energization switching element in accordance with a temperature of the fixing portion and a control zero cross signal, wherein the control portion generates the control zero-cross signal based on the pulse signal and a first correction value, wherein the first correction value is acquired by a period 1/4 of a difference between a first period tH of the first level H and a second period tL of the second level L, wherein a first edge of the control zero-cross signal. is generated at a timing when the first correction value is added to a first edge of the pulse signal, and wherein a second edge of the control zero-cross signal whose level is changed in a direction opposite to the first edge of the control zero-cross signal is generated at a timing at which a period (tH+tL)/2 has elapsed from the first edge of the control zero-cross signal.

11. The image forming apparatus according to claim 10, wherein the control portion generates the control zero-cross signal based on the pulse signal, the first correction value and a second correction value, wherein the second correction value is acquired by adding the first correction value and the period (tH+tL)/2, and wherein the second edge of the control zero-cross signal is generated at a timing when the second correction value is added to the first edge of the pulse signal.

12. The image forming apparatus according to claim 10, wherein the energization switching element includes a triac, and wherein a waveform flowing through the heater controlled by the control portion is a wavenumber control form controlled by a half wave unit of AC.

13. The image forming apparatus according to claim 10, wherein the fixing portion includes a cylindrical film and a pressing roller being in contact with an outer surface of the film, and wherein a fixing nip portion for sandwiching and conveying the sheet through the film is formed by the heater and the pressing roller.

14. An image forming apparatus for forming a toner image on a sheet, comprising:

a fixing portion configured to fix the toner image to the sheet, the fixing portion including a heater for heating the toner image;

a zero-cross detection circuit configured to detect a zero-cross of a commercial power source, the zero-cross detection circuit outputting pulse signal having a first level H which is a level when a voltage of the commercial power source is higher than a threshold and a second level L which is a level when the voltage of the commercial power source is lower than the threshold;

an energization switching element connected to the commercial power source and configured to switch electrical power supplied to the heater based on an energization signal; and a control portion configured to output the energization signal to the energization switching element in accordance with a temperature of the fixing portion and a control zero-cross signal, wherein the pulse signal outputted from the zero-cross detection circuit includes a lime constant, wherein the control portion generates the control zero-cross signal based on the pulse signal and a first correction value, wherein the first correction value is acquired by adding a fixed value toffset for the time constant to a period 1/4 of a difference between a first period tH of the first level H and a second period tL of the second level L, wherein a first edge of the control zero-cross signal. is generated at a timing when the first correction value is added to a first edge of the pulse signal, and wherein a second edge of the control zero-cross signal whose level is changed in a direction opposite to the first edge of the control zero-cross signal is generated at a timing at which. a period (tH+tL)/2 has elapsed from the first edge of the control zero-cross signal.

15. The image forming apparatus according to claim 14, wherein the control portion generates the control zero-cross signal based on the pulse signal, the first correction value and a second correction value, wherein the second correction value is acquired by adding the first correction value and the period (tH+tL)/2, and wherein the second edge of the control zero-cross signal is generated at a timing when the second correction value is added to the first edge of the pulse signal.

16. The image forming apparatus according to claim 14, wherein the energization switching element includes a triac, and wherein a waveform flowing through the heater controlled by the control portion is a wavenumber control form controlled by a half wave unit of AC.

17. The image forming apparatus according to claim 14, wherein the fixing portion includes a cylindrical film and a pressing roller being in contact with an outer surface of the film, and wherein a fixing nip portion for sandwiching and conveying the sheet through the film is formed by the heater and the pressing roller.

* * * * *